(12) United States Patent
Kotowski

(10) Patent No.: US 12,401,321 B2
(45) Date of Patent: Aug. 26, 2025

(54) BIAS CIRCUIT FOR CRYSTAL OSCILLATOR

(71) Applicant: Microchip Technology Incorporated, Chandler, AZ (US)

(72) Inventor: Jeff Kotowski, Nevada City, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/403,193

(22) Filed: Jan. 3, 2024

(65) Prior Publication Data
US 2025/0132728 A1    Apr. 24, 2025

Related U.S. Application Data

(60) Provisional application No. 63/544,795, filed on Oct. 19, 2023.

(51) Int. Cl.
*H03B 5/36* (2006.01)

(52) U.S. Cl.
CPC .................... *H03B 5/364* (2013.01)

(58) Field of Classification Search
CPC ........................................ H03B 5/364
See application file for complete search history.

(56) References Cited

U.S. PATENT DOCUMENTS

| | | | |
|---|---|---|---|
| 7,369,009 B2 * | 5/2008 | Hofer | H04L 27/12 331/116 R |
| 2010/0321123 A1 | 12/2010 | Casagrande | 331/116 FE |
| 2015/0061786 A1 * | 3/2015 | Mai | H03B 5/06 331/116 FE |
| 2016/0181978 A1 * | 6/2016 | Mittal | H03B 5/366 331/116 FE |

FOREIGN PATENT DOCUMENTS

CN     105577140 B     5/2016

OTHER PUBLICATIONS

International Search Report and Written Opinion, Application No. PCT/US2024/025349, 13 pages.

* cited by examiner

*Primary Examiner* — Jeffrey M Shin
(74) *Attorney, Agent, or Firm* — SLAYDEN GRUBERT BEARD PLLC

(57) ABSTRACT

A bias circuit may generate a one or more bias outputs for a crystal oscillator. The bias circuit may include a first current mirror, a second current mirror and a third current mirror. A capacitor may be coupled between the second current mirror and the third current mirror. In operation, a first bias output may be generated by the third current mirror, and a second bias output may be generated by the second current mirror. The first bias output and second bias output may be coupled to a crystal oscillator.

18 Claims, 4 Drawing Sheets

BIAS CIRCUIT FOR CRYSTAL OSCILLATOR

PRIORITY

This application claims priority to commonly owned U.S. Provisional Patent Application No. 63/544,795 filed Oct. 19, 2023, the entire contents of which are hereby incorporated by reference for all purposes.

FIELD OF THE INVENTION

The present disclosure relates to a bias circuit for a crystal oscillator.

BACKGROUND

Crystal oscillators may be driven with an input from an AC coupled driver circuit. Such examples may include high value resistors when using current levels below 100 nA. As one of various examples, resistor values may exceed 1 MΩ. Crystal oscillators with high value resistors may be large and expensive.

Other examples may utilize a class-A or class-C amplifier which may represent an inefficient solution which may waste current.

There is a need for a bias circuit which can operate at a low current bias point and eliminate the need for a high value resistor and provide a bias current for a crystal oscillator.

SUMMARY

The examples herein enable a device for generating a bias current for a crystal oscillator.

According to one aspect, a bias circuit includes a first current mirror comprising a current source coupled to a first current mirror device. The current source may be coupled to a first node and a second node of the first current mirror device. The third node of the first current mirror device may be coupled to a first fixed voltage. A second current mirror may include a second current mirror device and a first cascode device. A first node and a second node of the first cascode device may be coupled together and comprise a current path. A first node of the second current mirror device may be coupled to a third node of the first cascode device. A second node of the second current mirror device may be coupled to the current source. A third node of the second current mirror device may be coupled to the first fixed voltage. A third current mirror may include a third current mirror device and a second cascode device. A first node of the second cascode device may be coupled to an output driver. A second node of the second cascode device may be coupled to the second node of the first cascode device. A third node of the second cascode device may be coupled to a first node of the third current mirror device. A second node of the third current mirror device may be coupled to the current source. A third node of the third current mirror device may be coupled to the first fixed voltage. The output driver includes a first node coupled to the first node of the second cascode device, a second node coupled to a first node of a capacitor, and a third node coupled to a second fixed voltage. The first node of the output driver may be a first bias output and the second node of the output driver may be a second bias output. The capacitor includes a first node coupled to a second node of the output driver and a second node coupled to the second node of the second cascode device.

According to one aspect, a system includes a bias circuit to generate a first bias output and a second bias output based on a first current mirror. The first current mirror may include a current source and a first current mirror device. The system may include a crystal oscillator to receive input from the first bias output and the second bias output and to generate an oscillation output.

According to one aspect, a method includes steps of: generating a reference current in a first current mirror, generating a first bias output, the first bias output based on the reference current, generating a second bias output, the second bias output based on the reference current, outputting the first bias output and the second bias output to a crystal oscillator.

DETAILED DESCRIPTION

Figure 1:
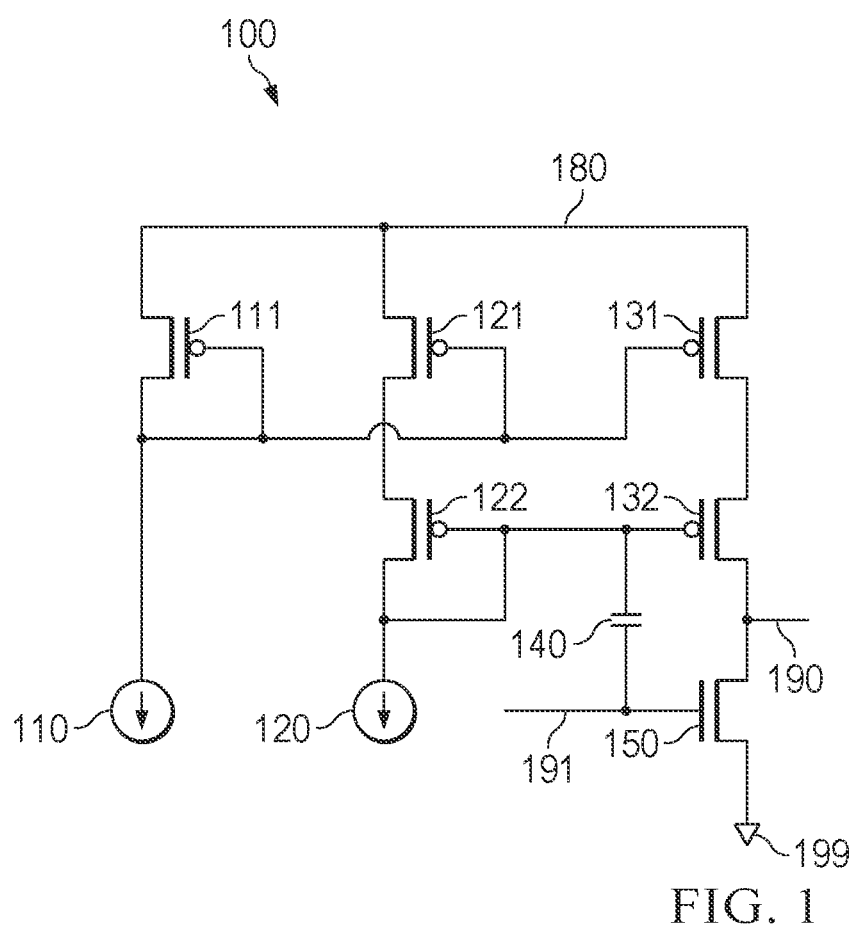
FIG. 1 illustrates one of various examples of a bias circuit.

FIG. 1 illustrates one of various examples of a bias circuit 100 for a crystal oscillator.

Bias circuit 100 may include current source 110. Current source 110 may be a dependent current source or an independent current source. Current source 110 may be a current mirror or may be another type of current source not specifically mentioned. Current source 110 may generate a reference current. Current source 110 may be coupled to first current mirror device 111. In one of various examples, current source 110 may be coupled to a first node and a second node of first current mirror device 111. In one of various examples, first current mirror device 111 may comprise a metal-oxide semiconductor field-effect (MOSFET) device and current source 110 may be coupled to a drain node and a gate node of first current mirror device 111. A third node of first current mirror device 111 may be coupled to first fixed voltage 180. The third node of first current mirror device may comprise a source node. First fixed voltage 180 may be a positive supply voltage.

Current source 110 and first current mirror device 111 may comprise a first current mirror.

Bias circuit 100 may include second current mirror device 121 and first cascode device 122. In one of various examples, a first node of second current mirror device 121 may be coupled to first cascode device 122 and the first node of second current mirror device 121 may comprise a drain node of a MOSFET device. In one of various examples, a second node of second current mirror device 121 may be coupled to current source 110 and the second node of second current mirror device 121 may be a gate node of a MOSFET device. A third node of second current mirror device 121 may be coupled to first fixed voltage 180, and the third node of second current mirror device 121 may comprise a source node of a MOSFET device. First fixed voltage 180 may be a positive supply voltage.

Current path 120 may be coupled to first cascode device 122. Current path 120 may be coupled to other circuitry not specifically mentioned or illustrated. In one of various examples, current path 120 may be coupled to a first node and a second node of first cascode device 122. In one of various examples, first cascode device 122 may comprise a MOSFET device and current path 120 may be coupled to a drain node and a gate node of first cascode device 122. A third node of first cascode device 122 may be coupled to the first node of second current mirror device 121.

Second current mirror device 121 and first cascode device may comprise a second current mirror.

Bias circuit 100 may include third current mirror device 131, second cascode device 132 and output driver 150. A first node of output driver 150 may be coupled to a first node of second cascode device 132. The first node of output driver 150 may comprise a drain node of a MOSFET device. The first node of output driver 150 may be first bias output 190. In one of various examples, a second node of output driver 150 may be coupled to a first node of capacitor 140 and the second node of output driver 150 may be a gate node of a MOSFET device. The second node of output driver 150 may be second bias output 191. In one of various examples, output driver 150 may be a MOSFET device and a third node of output driver 150 may be coupled to a second fixed voltage 199. Second fixed voltage 199 may be a ground return. Second fixed voltage 199 may be a negative supply voltage. Second fixed voltage 199 may be a positive supply voltage.

In one of various examples, the first node of output driver 150 may be coupled to a first node of second cascode device 132 and the first node of second current cascode device 132 may comprise a drain node of a MOSFET device. In one of various examples, a second node of second cascode device 132 may be coupled to the second node of first cascode device 122 and to a second node of capacitor 140, and the second node of second cascode device 132 may be a gate node of a MOSFET device. A third node of second cascode device 132 may be coupled to a first node of third current source device 131. The first node of third current source device 131 may comprise a drain node of a MOSFET device. A second node of third current mirror device 131 may be coupled to current source 110 and may comprise a gate node of a MOSFET device. A third node of third current mirror device may be coupled to first fixed voltage 180 and may comprise a source node of a MOSFET device.

Third current mirror device 131 and second cascode device 132 may comprise a third current mirror.

In operation, first current mirror device 111 and second current mirror device 121 may be sized such that first current source 110 may supply a current equal to twice the current flowing through second current mirror device 121. In other examples, first current mirror device 111 and second current mirror device 121 may be sized such that first current source 110 may supply a current of a multiple of the current flowing through second current mirror device 121. The lower current through second current mirror device 121 may bias second current mirror device 121 in the triode region.

The maximum current flowing to first bias output 190 may be limited by the maximum current flowing through third current mirror device 131. In one of various examples, third current mirror device 131 may be sized to be a larger size than second current mirror device 121 by a factor of N, and second cascode device 132 may be sized to be a larger size than first cascode device 122 by a factor of N. In this example, the maximum current flowing to first bias output 190 may be N*I, where I represents the value of current flowing through first current mirror device 111. The factor N may be a real number value.

In one of various examples, bias circuit 100 may create a high impedance at the second node of first cascode device 122. In one of various examples, for a value of I=5 nA, an equivalent resistance of 100 M Ohms may be introduced at the second node of first cascode device 122.

In operation, first bias output 190 and second bias output 191 may be coupled to a crystal oscillator. The crystal oscillator may oscillate based on first bias output 190 and second bias output 191.

In the example illustrated in FIG. 1, first current mirror device 111, second current mirror device 121 and third current mirror device 131 are illustrated as p-channel metal-oxide semiconductor (PMOS) devices, but this is not intended to be limiting. In other examples, first current mirror device 111, second current mirror device 121 and third current mirror device 131 may be n-channel metal-oxide semiconductor (NMOS) devices, bipolar junction transistors (BJTs) or other transistor types not specifically mentioned.

In the example illustrated in FIG. 1, first cascode device 122, second cascode device 132 are illustrated as PMOS devices, but this is not intended to be limiting. In other examples, first cascode device 122 and second cascode device 132 131 may be NMOS devices, bipolar junction transistors (BJTs) or other transistor types not specifically mentioned.

In the example illustrated in FIG. 1, output driver 150 is illustrated as an NMOS device, but this is not intended to be limiting. In other examples, output driver 150 may be a PMOS device, a BJT, or other transistor type not specifically mentioned. In examples with a PMOS output driver 150, first cascode device 122 and second cascode device 132 may be NMOS devices, and first current mirror device 111, second current mirror device 121 and third current mirror device 131 may be NMOS devices.

Figure 2:
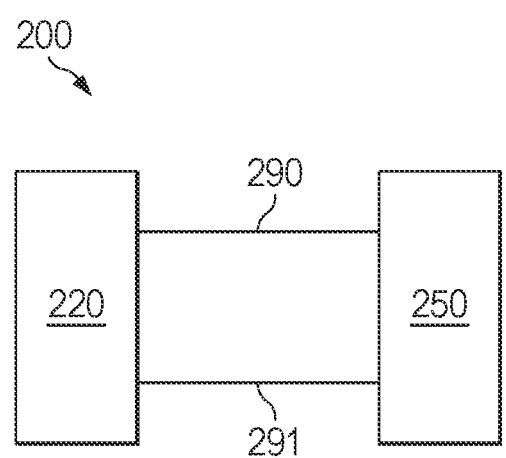
FIG. 2 illustrates one of various examples of a crystal oscillator system.

FIG. 2 illustrates one of various examples of a crystal oscillator system 200.

Bias circuit 220 may generate a first bias output 290. First bias output 290 may represent one of various examples of first bias output 190 as described and illustrated in reference to FIG. 1.

Bias circuit 220 may generate a second bias output 291. Second bias output 291 may represent one of various examples of second bias output 191 as described and illustrated in reference to FIG. 1.

First bias output 290 may be coupled to crystal oscillator 250. Second bias output 291 may be coupled to crystal oscillator 250. Crystal oscillator 250 may generate an oscillator output at first bias output 290 based at least on first bias output 290 and second bias output 291.

Figure 3:
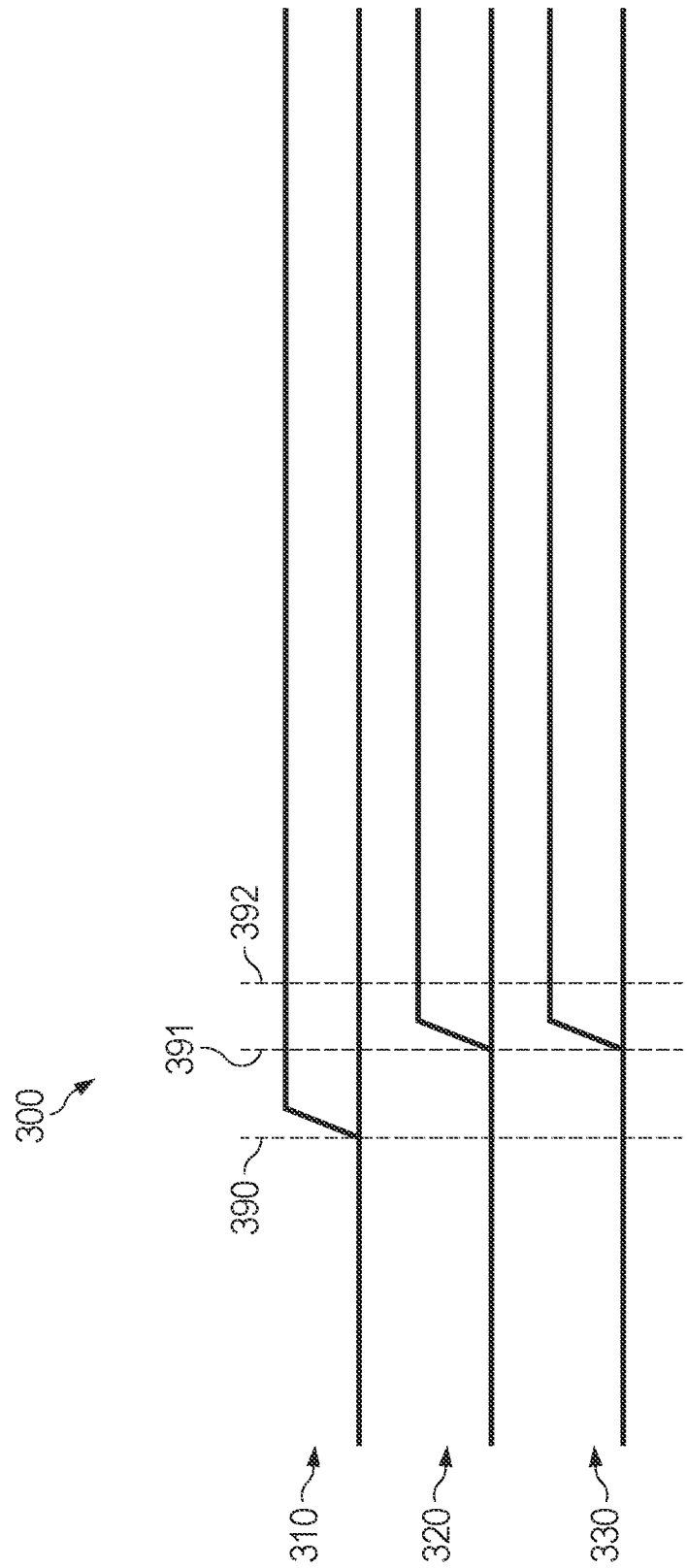
FIG. 3 illustrates a timing diagram of a bias circuit and crystal oscillator system.

FIG. 3 illustrates one of various examples of a timing diagram of a crystal oscillator system.

Trace 310 may represent a bias current. Trace 310 may represent one of various examples of a current supplied by current source 110 as described and illustrated in reference to FIG. 1. Prior to time 390, the bias current may be zero. At time 390, a bias current may be generated, indicated by the change in trace 310. The change in trace 310 is intended to indicate a bias current at a non-zero level. The height of trace 310 should not be interpreted to represent a specific numerical value of voltage.

Trace 320 may represent a first bias output. Trace 320 may represent one of various examples of first bias output 190 as described and illustrated in reference to FIG. 1. Prior to time 391, the first bias output may be at a zero voltage level. At time 391, the first bias output may transition to a non-zero value based on the bias current, indicated by the change in trace 320. The change in trace 320 is intended to indicate the first bias output at a non-zero level. Trace 320 may be coupled to a crystal oscillator, and the crystal oscillator may begin to oscillate based on the level of trace 320. The oscillation may be a sinusoidal signal.

Trace 330 may represent a second bias output. Trace 330 may represent one of various examples of second bias output 191 as described and illustrated in reference to FIG. 1. Prior to time 391, the second bias output may be at a zero voltage. At time 391, the second bias output may transition to a non-zero value based on the bias current, indicated by the change in trace 330. The change in trace 330 is intended to indicate the second bias output at a non-zero level. Trace 320 may be coupled to a crystal oscillator.

The relative timing between time 390, time 391 and time 392 is not intended to be limiting. The time between time 390 and time 391 may be larger or smaller than illustrated in FIG. 3. The time between time 391 and time 392 may be larger or smaller than illustrated in FIG. 3. In one of various examples, trace 320 and trace 330 may transition to non-zero values at the same time or trace 330 may transition to a non-zero value after trace 320 transitions to a non-zero value.

Figure 4:
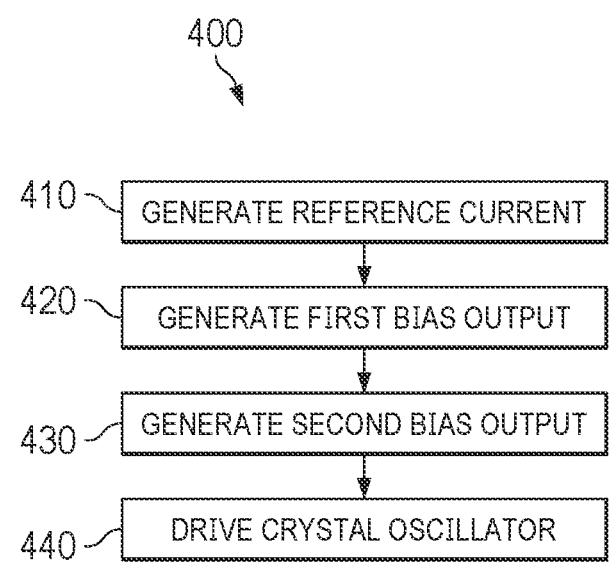
FIG. 4 illustrates a method of biasing a crystal oscillator.

FIG. 4 illustrates a method to bias a crystal oscillator circuit.

At operation 410, a reference current may be generated.

At operation 420, a first bias output may be generated, the first bias output at least based on the reference current. The first bias output may be based on a current one-half the value of the reference current.

At operation 430, a second bias output may be generated, the second bias output at least based on the reference current.

At operation 440, the first bias output and second bias output may be coupled to a crystal oscillator to drive the crystal oscillator.

The invention claimed is:

1. A bias circuit comprising:
    a first current mirror comprising a current source coupled to a first current mirror device, the current source coupled to a first node and a second node of the first current mirror device, wherein the third node of the first current mirror device is coupled to a first fixed voltage;
    a second current mirror comprising a second current mirror device and a first cascode device, wherein:
        a first node and a second node of the first cascode device are coupled together and comprise a current path;
        a first node of the second current mirror device is coupled to a third node of the first cascode device;
        a second node of the second current mirror device is coupled to the current source;
        a third node of the second current mirror device is coupled to the first fixed voltage;
    a third current mirror comprising a third current mirror device and a second cascode device, wherein:
        a first node of the second cascode device is coupled to an output driver;
        a second node of the second cascode device is coupled to the second node of the first cascode device;
        a third node of the second cascode device is coupled to a first node of the third current mirror device;
        a second node of the third current mirror device is coupled to the current source;
        a third node of the third current mirror device is coupled to the first fixed voltage;
    wherein the output driver comprises a first node coupled to the first node of the second cascode device, a second node coupled to a first node of a capacitor, and a third node coupled to a second fixed voltage, the first node of the output driver comprising a first bias output and the second node of the output driver comprising a second bias output; and
    wherein the capacitor comprises a first node coupled to a second node of the output driver and a second node coupled to the second node of the second cascode device.

2. The bias circuit as claimed in claim 1, the first fixed voltage comprising a positive supply voltage.

3. The bias circuit as claimed in claim 1, the second fixed voltage comprising a negative supply voltage.

4. The bias circuit as claimed in claim 1, the second fixed voltage comprising a ground return.

5. The bias circuit as claimed in claim 1, the second fixed voltage comprising a positive supply voltage.

6. The bias circuit as claimed in claim 1, the current through the current source equal to twice the current through the second current mirror device and the first cascode device.

7. The bias circuit as claimed in claim 1, the size of the third current mirror device a multiple of the size of the second current mirror device.

8. The bias circuit as claimed in claim 1, the size of the second cascode device a multiple of the size of the first cascode device.

9. A crystal oscillator system comprising:
    a bias circuit to generate a first bias output and a second bias output based on a first current mirror, the first current mirror comprising a current source and a first current mirror device;
    a crystal oscillator to receive input from the first bias output and the second bias output and to generate an oscillation output;
    the bias circuit comprising a second current mirror to receive input from the current source and a third current mirror to receive input from the current source;
    the third current mirror comprising a third current mirror device coupled to a second cascode device and an output driver coupled to the second cascode device, and
    a capacitor coupled between a gate of the output driver and the second cascode device.

10. The crystal oscillator system as claimed in claim 9, the second current mirror comprising a second current mirror device coupled to a first cascode device.

11. The crystal oscillator system as claimed in claim 9, the first bias output at a zero voltage level at a first time and the first bias output at a non-zero voltage level at a second time, the second time after the first time.

12. The crystal oscillator system as claimed in claim 9, the second bias output at a zero voltage level at a first time and the second bias output at a non-zero voltage level at a second time, the second time after the first time.

13. The crystal oscillator system as claimed in claim 9, at a predetermined time, the first bias output at a non-zero voltage level and the second bias output at a zero voltage level.

14. The crystal oscillator system as claimed in claim 9, at a predetermined time, the first bias output at a zero voltage level and the second bias output at a non-zero voltage level.

15. The crystal oscillator system as claimed in claim 9, the first bias output and the second bias output to transition to a non-zero voltage level simultaneously.

16. The crystal oscillator system as claimed in claim 9, the crystal oscillator to oscillate based on the first bias output.

17. The crystal oscillator system as claimed in claim 9, the crystal oscillator to oscillate based on the second bias output.

18. A method comprising:
generating a reference current in a first current mirror;
generating a first bias output, the first bias output based on the reference current, the first bias output based on a current in a cascode device coupled to a current mirror device directly coupled to the reference current;
generating a second bias output, the second bias output based on the reference current; and
outputting the first bias output and the second bias output to a crystal oscillator, further comprising a capacitor coupled between the second bias output and the cascode device.

* * * * *